(12) United States Patent
Tang et al.

(10) Patent No.: US 10,854,695 B2
(45) Date of Patent: Dec. 1, 2020

(54) OLED DISPLAY PANEL WITH BLACK PIXEL DEFINING LAYER AND FLAT LAYER

(71) Applicant: WUHAN CHINA STAR OPTOELECTRONICS TECHNOLOGY CO., LTD., Wuhan (CN)

(72) Inventors: Yuejun Tang, Wuhan (CN); Xueyun Li, Wuhan (CN)

(*) Notice: Subject to any disclaimer, the term of this patent is extended or adjusted under 35 U.S.C. 154(b) by 0 days.

(21) Appl. No.: 16/467,042

(22) PCT Filed: Feb. 21, 2019

(86) PCT No.: PCT/CN2019/075641
§ 371 (c)(1),
(2) Date: Jun. 6, 2019

(87) PCT Pub. No.: WO2020/107724
PCT Pub. Date: Jun. 4, 2020

(65) Prior Publication Data
US 2020/0235177 A1      Jul. 23, 2020

(30) Foreign Application Priority Data
Nov. 30, 2018     (CN) .......................... 2018 1 1457966

(51) Int. Cl.
*H01L 27/32*     (2006.01)

(52) U.S. Cl.
CPC ...... *H01L 27/3246* (2013.01); *H01L 27/3262* (2013.01); *H01L 27/3272* (2013.01)

(58) Field of Classification Search
CPC .................... H01L 27/3246; H01L 27/3272
See application file for complete search history.

(56) References Cited

U.S. PATENT DOCUMENTS

| | | | |
|---|---|---|---|
| 2011/0074753 A1* | 3/2011 | Yamamoto | G09G 3/3233 345/207 |
| 2012/0049215 A1* | 3/2012 | Yoon | H01L 27/3246 257/91 |
| 2018/0033847 A1* | 2/2018 | Kim | H01L 27/1255 |
| 2018/0083085 A1* | 3/2018 | Moon | H01L 27/3248 |
| 2019/0172887 A1* | 6/2019 | Sun | H01L 27/3258 |

* cited by examiner

*Primary Examiner* — John P. Dulka

(57) ABSTRACT

The present invention provides an OLED display panel. The display panel includes a plurality of sub-pixels arranged in an array. Each of the sub-pixels comprises a base substrate, a TFT layer, a flat layer, a first electrode, a pixel defining layer, a light emitting layer, a transparent second electrode, and an encapsulation layer. A portion of at least one of the flat layer and the pixel defining layer is formed by a black shielding material. The OLED display panel can be prevented from reflecting ambient light without improving the light extraction efficiency, thereby improving the viewing experience of the OLED display panel by the arrangement of a portion of at least one of the flat layer and the pixel defining layer is formed by a black shielding material.

3 Claims, 12 Drawing Sheets

OLED DISPLAY PANEL WITH BLACK PIXEL DEFINING LAYER AND FLAT LAYER

FIELD OF INVENTION

The present invention relates to the field of display technologies, and in particular, to an organic light emitting display (OLED) display panel.

BACKGROUND OF INVENTION

Organic light emitting display (OLED) devices not only have excellent display performance, but also have self-illumination, simple structure, ultra-thin, fast response times, wide viewing angles, low power consumption and flexible display. Known as "Dream Displays," they have been favored by major display manufacturers and have become the main force of third generation display devices in the display technology field.

An OLED display panel is a self-emissive display device, and generally includes a pixel electrode serving as one of an anode and a cathode, a common electrode serving as the other of the anode and the cathode, and an organic light emitting layer disposed between the pixel electrode and the common electrode. The layer is such that light is emitted from the organic light emitting layer when a suitable voltage is applied to the anode and the cathode. The organic light emitting layer includes a hole injection layer provided on the anode, a hole transport layer provided on the hole injection layer, a light-emitting layer provided on the hole transport layer, and an electron transport layer provided on the light-emitting layer, and an electron injection layer provided on the electron transport layer. The principle of illumination of the organic light emitting layer is that driven by a certain voltage, electrons and holes are injected from the cathode and the anode to the electron injection layer and the hole injection layer, respectively, and the electrons and holes pass through the electron transport layer and the hole transport layer and migrate to the light-emitting layer, and they meet in the light-emitting layer to form excitons and excite the light-emitting molecules, which undergo radiation relaxation to emit visible light.

Depending on the direction of illumination, the OLED display panel includes both a top-emitting type and a bottom-emitting type. The top-emitting type is the most commonly used OLED display panel type. As shown in FIG. 1, it generally includes a base substrate 100, a thin-film transistor (TFT) layer 101 disposed on the base substrate 100, a flat layer 102 disposed on the TFT layer 101, a first electrode 103 disposed on the flat layer 102, a pixel defining layer 104 disposed on the first electrode 103 and the flat layer 102, a pixel defining groove 1041 disposed in the pixel defining layer 104 and exposing a portion of the first electrode 103, a light emitting layer 105 disposed in the pixel defining groove 1041, a second electrode 106 disposed on the light-emitting layer 105 and the pixel defining groove 1041, and an encapsulation layer 107 disposed on the second electrode 106. The flat layer 102 and the pixel defining groove 1041 are both transparent film layers, thereby making the external ambient light is irradiated onto the TFT layer 101 within the OLED display panel through the flat layer 102 and the pixel defining groove 1041, and then reflected by the flat layer 102 and the pixel defining groove 1041 into human eye, thereby affecting the normal viewing of the user. As a result, in the existing OLED display panels, an anti-reflection layer structure is disposed on the surface to avoid the influence of ambient light, and generally the anti-reflection layer structure is a circular polarizer. However, the use of a circular polarizer will reduce the light extraction efficiency.

SUMMARY OF INVENTION

An object of the present invention is to provide an OLED display panel capable of preventing the OLED display panel from reflecting ambient light and improving the viewing experience of the OLED display panel without reducing the light extraction efficiency.

To achieve the above object, the present invention provides an OLED display panel comprising a plurality of sub-pixels arranged in an array, wherein each of the sub-pixels comprises a base substrate, a TFT layer disposed on the base substrate, a flat layer disposed on the TFT layer, a first electrode disposed on the flat layer, a pixel defining layer disposed on the first electrode and the flat layer, a light emitting layer disposed on the first electrode, a transparent second electrode disposed on the light emitting layer and the pixel defining layer, and an encapsulation layer disposed on the second electrode; and A portion of at least one of the flat layer and the pixel defining layer is formed by a black shielding material.

One of the flat layer and the pixel defining layer is formed by the black shielding material, and another layer is formed by a transparent material.

Both the flat layer and the pixel defining layer are formed by the black shielding material.

Each of the sub-pixels has a transparent area and a non-transparent area arranged in turn, and the first electrode and the light emitting layer are located in the non-transparent area.

The flat layer and the pixel defining layer simultaneously cover the transparent area and the non-transparent area, the pixel defining layer and the flat layer that is in the transparent area are formed by the transparent material, and the flat layer in the non-transparent area is formed by the black shielding material.

The flat layer and the pixel defining layer simultaneously cover the transparent area and the non-transparent area, the flat layer and the pixel defining layer that is in the transparent area are formed by the transparent material, and the pixel defining layer in the non-transparent area is formed by the black shielding material.

The flat layer and the pixel defining layer simultaneously cover the transparent area and the non-transparent area, both the flat layer and the pixel defining layer in the transparent area are formed by the transparent material, and both the pixel defining layer and flat layer in the non-transparent area are formed by the black shielding material.

Both the flat layer and the pixel defining layer cover the non-transparent area, and both the flat layer and the pixel defining layer are formed by the black shielding material.

The flat layer covers the non-transparent area, and the pixel defining layer simultaneously covers the non-transparent area and the transparent area, the flat layer is formed by the black shielding material, and the pixel defining layer is formed by the transparent material.

The pixel defining layer covers the non-transparent area, the flat layer simultaneously covers the non-transparent area and the transparent area, the pixel defining layer is formed by the black shielding material, and the flat layer is formed by the transparent material.

The beneficial effects of the invention: The present invention provides an OLED display panel comprising a plurality of sub-pixels arranged in an array. Each of the sub-pixels comprises a base substrate, a TFT layer disposed on the base substrate, a flat layer disposed on the TFT layer, a first electrode disposed on the flat layer, a pixel defining layer disposed on the first electrode and the flat layer, a light emitting layer disposed on the first electrode, a transparent second electrode disposed on the light emitting layer and the pixel defining layer, and an encapsulation layer disposed on the second electrode. A portion of at least one of the flat layer and the pixel defining layer is formed by a black shielding material. The OLED display panel can be prevented from reflecting ambient light without improving the light extraction efficiency, thereby improving the viewing experience of the OLED display panel by the arrangement of a portion of at least one of the flat layer and the pixel defining layer is formed by a black shielding material.

DESCRIPTION OF DRAWINGS

In order to further understand the features and technical details of the present invention, please refer to the following detailed description and drawings regarding the present invention. The drawings are provided for reference and description only and are not intended to limit the present invention.

In the drawings.

DETAILED DESCRIPTION OF PREFERRED EMBODIMENTS

Figure 1:
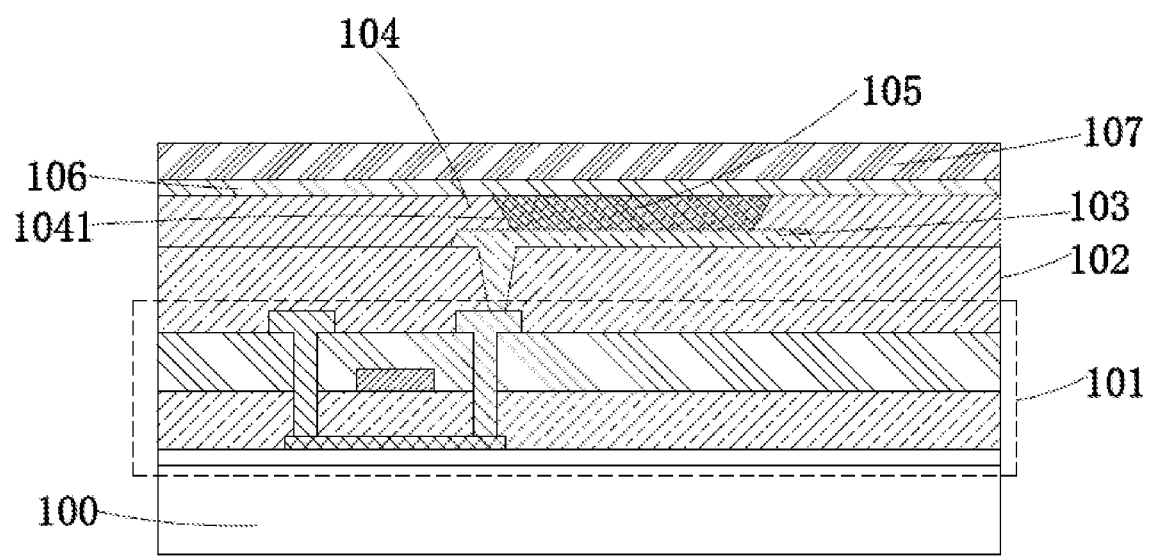
FIG. 1 is a structural view of a conventional OLED display panel.

In order to further clarify the technical means and effects of the present invention, the following detailed description will be made in conjunction with the preferred embodiments of the invention and the accompanying drawings.

Referring to FIG. 2 to FIG. 12, the present invention provides an OLED display panel including a plurality of sub-pixels 10 arranged in an array. Each of the sub-pixels 10 includes a base substrate 1 and a TFT disposed on the base substrate 1, a TFT (Thin-Film Transistor) layer 2 disposed on the base substrate 1, a flat layer 3 disposed on the TFT layer 2, a first electrode 4 disposed on the flat layer 3, a pixel defining layer 5 disposed on the first electrode 4 and the flat layer 3, a light emitting layer 6 disposed on the first electrode 4, a transparent second electrode 7 disposed on the light emitting layer 6 and the pixel defining layer 5, and an encapsulation layer 8 disposed on the second electrode 7; and A portion of at least one of the flat layer 3 and the pixel defining layer 5 is formed using a black light shielding material.

Specifically, the TFT layer 2 is formed with a pixel driving circuit of an OLED display panel, and may include a driving TFT, a switching TFT, a storage capacitor, and the like. As shown in FIGS. 3 to 5 and FIGS. 6 to 12, in some embodiments of the present invention, the TFT layer 2 specifically includes a buffer layer 21 disposed on the base substrate 1, a semiconductor layer 22 disposed on the buffer layer 21, a gate insulating layer 23 disposed on the buffer layer 21 and the semiconductor layer 22, a gate electrode 24 disposed on the gate insulating layer 23, an interlayer insulating layer 25 disposed on the gate electrode 24 and the gate insulating layer 23, and a source electrode 261 and a drain electrode 262 disposed on the interlayer insulating layer 25.

Further, only one TFT in the pixel driving circuit is shown in FIGS. 3 to 5 and 6 to 12, but this is not a limitation of the present invention. In fact, a plurality of TFTs and storage capacitors can be formed in the TFT layer 2 of the OLED display panel of the present invention for driving the OLED to emit light and performing brightness compensation on the OLED.

Further, the source electrode 261 and the drain electrode 262 are respectively in contact with both ends of the semiconductor layer 22 through two via holes penetrating the gate insulating layer 23 and the interlayer insulating layer 25. The first electrode 4 is in contact with the drain electrode 262 through a via extending through the flat layer 3.

Further, the pixel defining layer 5 is formed with a pixel defining groove 51 at a position corresponding to the first electrode 4, the pixel defining groove 51 exposing a part of the first electrode 4, and the light emitting layer 6 is formed in the pixel defining groove 51.

Figure 2:
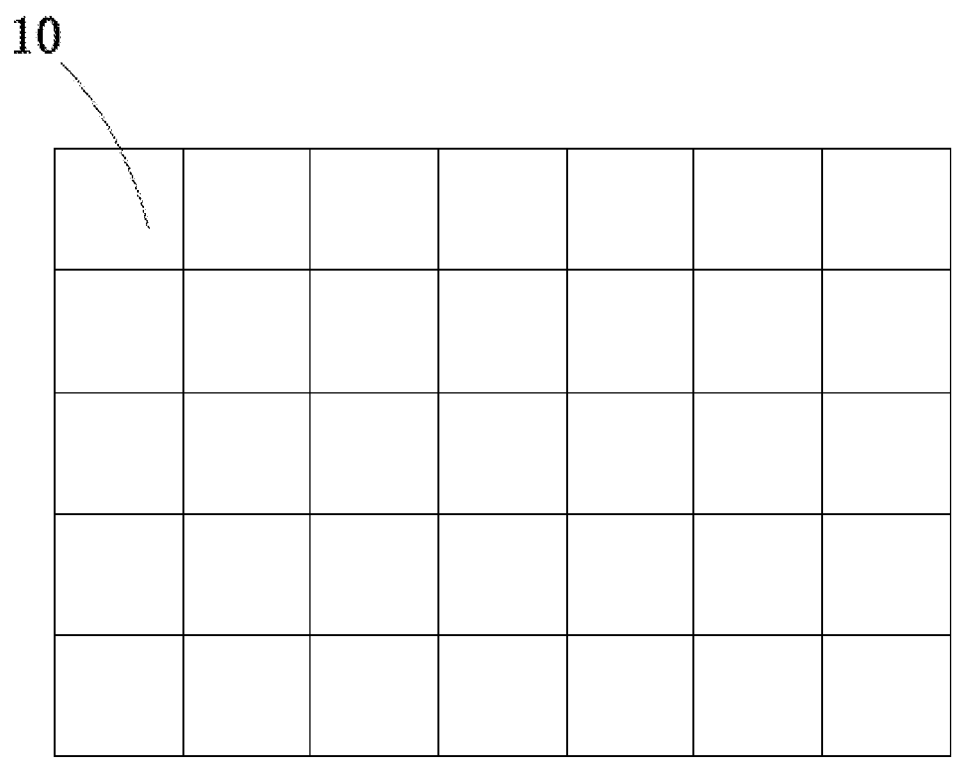
FIG. 2 is a schematic view showing first to third embodiments of an OLED display panel of the present invention.
Figure 3:
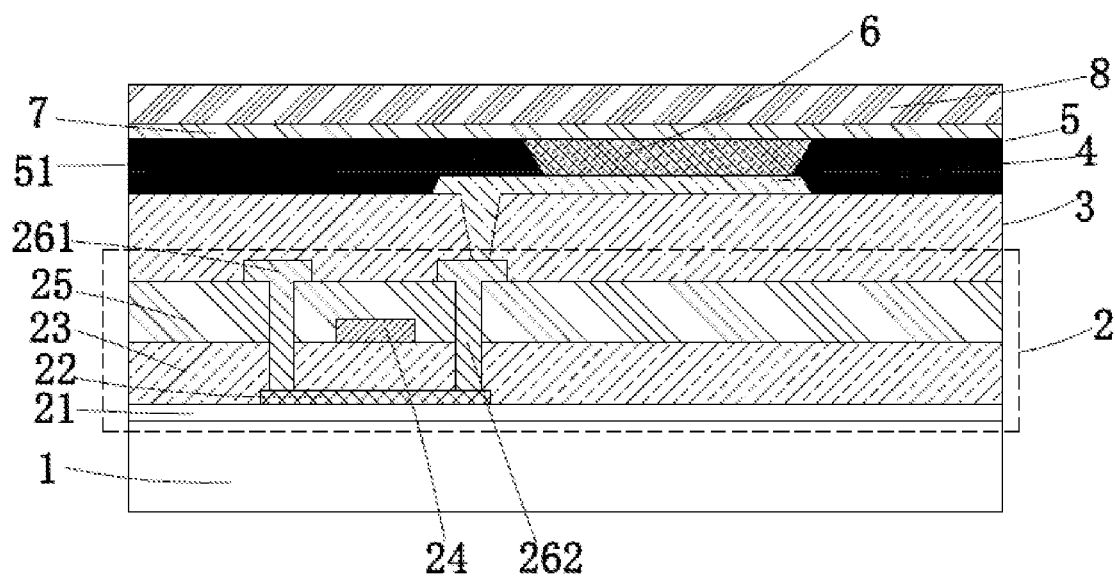
FIG. 3 is a structural view of a sub-pixel in a first embodiment of the OLED display panel of the present invention.

Specifically, as shown in FIG. 2 and FIG. 3, in the first embodiment of the present invention, the OLED display panel is a top-emitting OLED display panel, and the first electrode 4 is a reflective electrode. In the OLED display panel, in each of the sub-pixels 10, the pixel defining layer 5 is formed by the black shielding material, and the flat layer 3 is formed by a transparent material.

Figure 4:
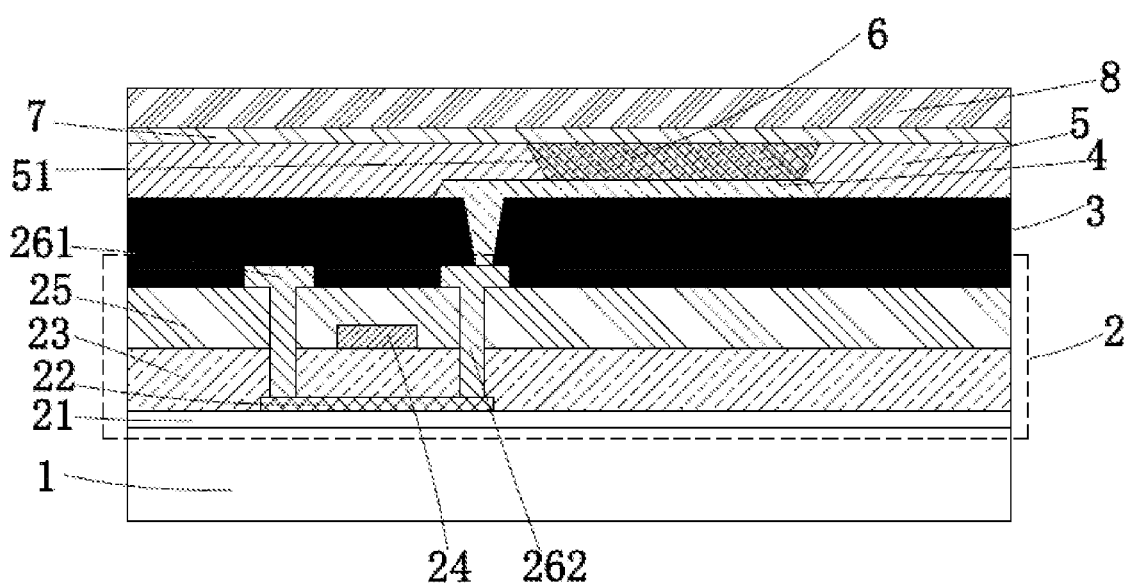
FIG. 4 is a structural view of a sub-pixel in a second embodiment of the OLED display panel of the present invention.

Specifically, as shown in FIG. 2 and FIG. 4, in the second embodiment of the present invention, the OLED display panel is a top-emitting OLED display panel, and the first electrode 4 is a reflective electrode. In the OLED display panel, in each of the sub-pixels 10, the flat layer 3 is formed by the black shielding material, and the pixel defining layer 5 is formed by the transparent material.

Figure 5:
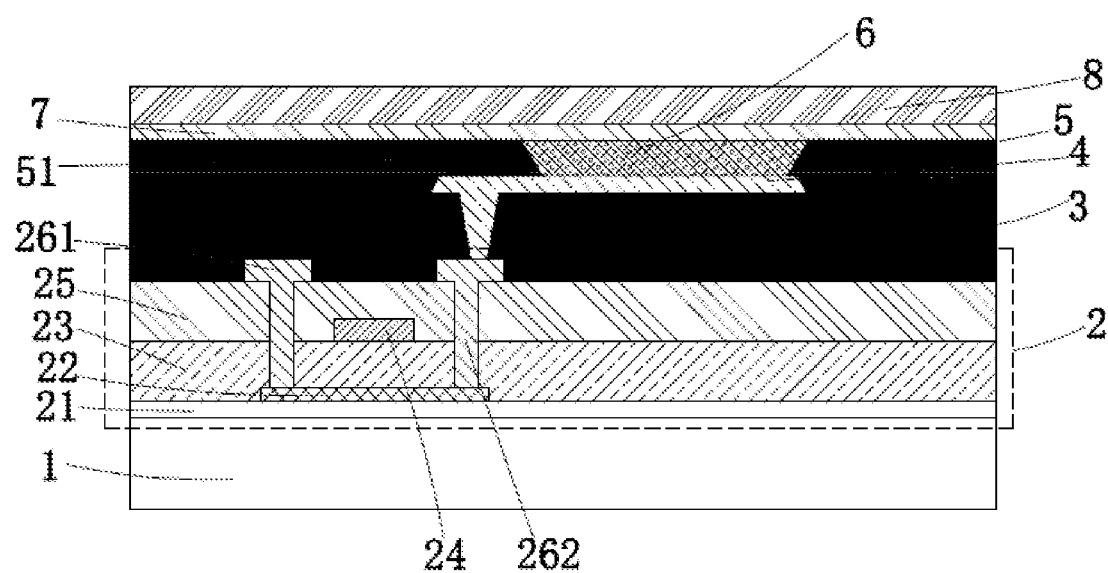
FIG. 5 is a structural view of a sub-pixel in a third embodiment of the OLED display panel of the present invention.
Figure 6:
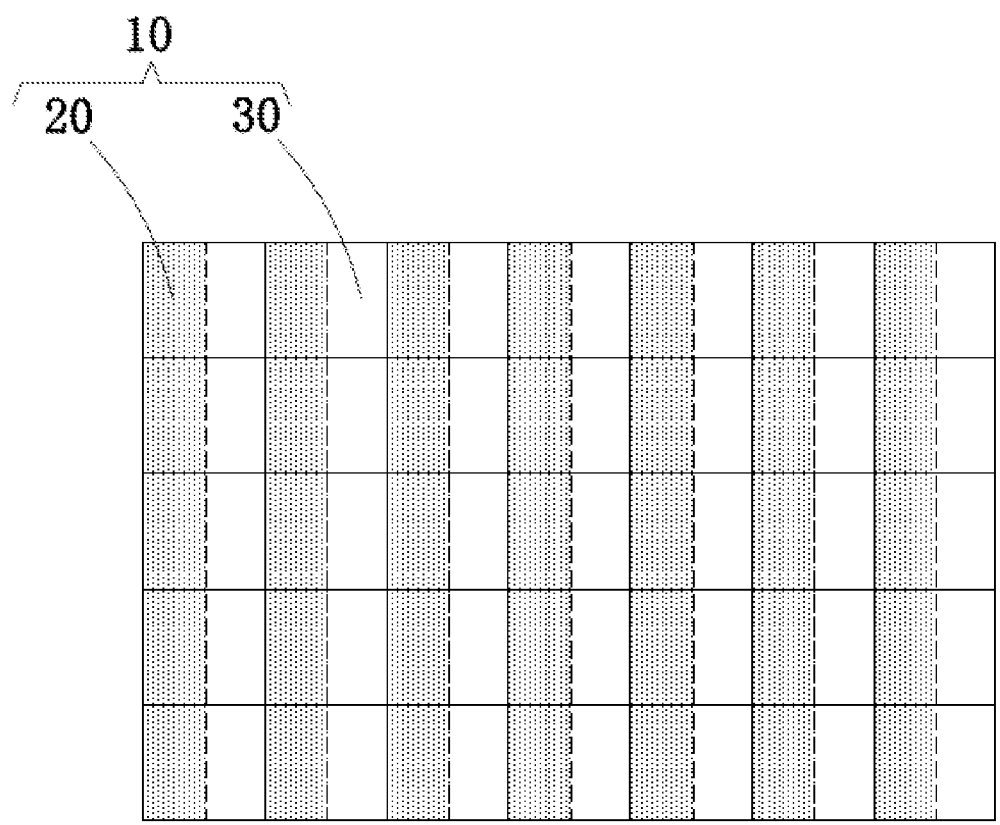
FIG. 6 is a schematic view showing fourth to eighth embodiments of the OLED display panel of the present invention.

Specifically, as shown in FIG. 2 and FIG. 5, in the third embodiment of the present invention, the OLED display panel is a top-emitting OLED display panel, and the first electrode 4 is a reflective electrode. In the OLED display panel, in each of the sub-pixels 10, the flat layer 3 and the pixel defining layer 5 are formed by the black shielding material.

Further, in the first to third embodiments of the present invention, the present invention is formed by arranging at least one of the flat layer 3 and the pixel defining layer 5 of the top-emitting type OLED display panel with the black shielding material, thereby making at least one of the flat layer 3 and the pixel defining layer 5 can block/absorb ambient light, prevent ambient light from being radiated into the TFT layer 2 through the flat layer 3 and the pixel defining layer 5, and being reflected by the metal in the TFT layer 2 into the eyes of the user, which may affect user viewing.

Specifically, as shown in FIG. 6 to FIG. 12, in the fourth to ninth embodiments of the present invention, the OLED display panel is a transparent OLED display panel. The first electrode 4 is a reflective electrode, a transparent electrode or a partially transparent electrode, each of the sub-pixels 10 has a transparent area 20 and a non-transparent area 30 arranged in sequence, and the first electrode 4 and the light-emitting layer 6 are located in the non-transparent area 30. Further, the TFT layer 2 includes a non-transparent structure having the semiconductor layer 22, the gate electrode 24, the source electrode 261, and the drain electrode 262 is also located in the non-transparent area 30. The TFT layer 2 includes the transparent structure having the gate insulating layer 23 and the interlayer insulating layer 25 covers both the transparent area 20 and the non-transparent area 30.

Further, the non-transparent area 30 includes a display area 302 and a non-display area 301. The display area 302 is correspondingly disposed with the light-emitting layer 6. The light of the OLED display panel is emitted from the display area 302. A portion of the non-transparent area 30 other than the display area 302 is a non-display area 301, and the semiconductor layer 22, the gate electrode 24, the source electrode 261, and the drain electrode 262 in the TFT layer 2 are all located in the non-display area 301.

Figure 7:
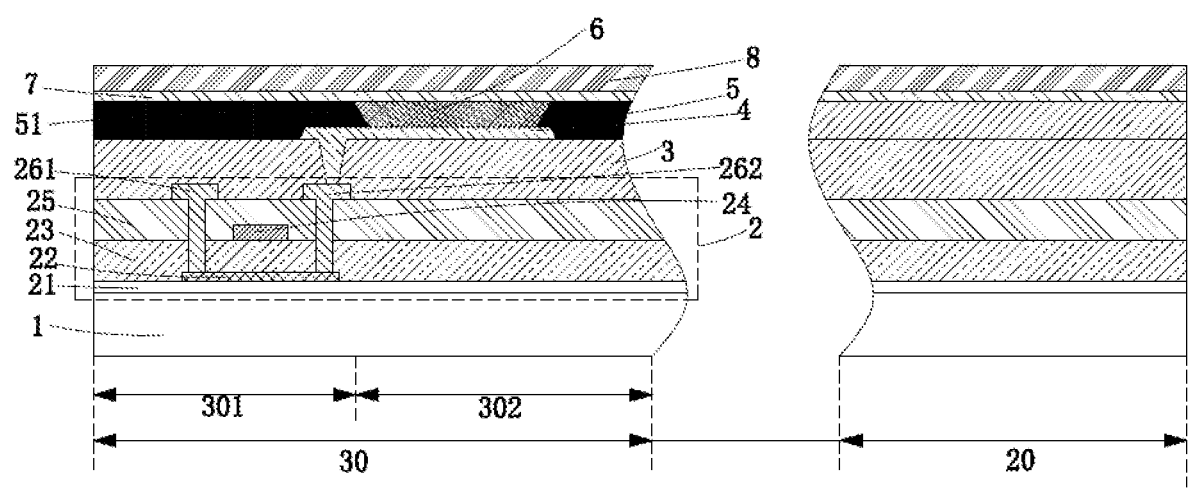
FIG. 7 is a structural view of a sub-pixel in a fourth embodiment of the OLED display panel of the present invention.

Specifically, as shown in FIG. 7, in the fourth embodiment of the present invention, the flat layer 3 and the pixel defining layer 5 simultaneously cover the transparent area 20 and the non-transparent area 30. The flat layer 3 and the pixel defining layer 5 that is in the transparent area 20 are formed by the transparent material, and the pixel defining layer 5 in the non-transparent area 30 is formed by the black shielding material.

Figure 8:
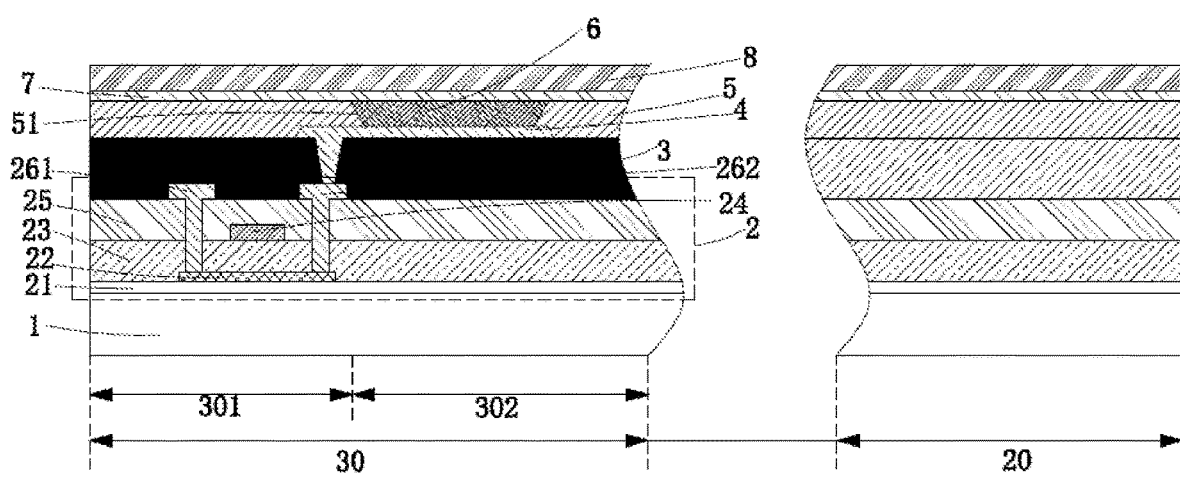
FIG. 8 is a structural view of a sub-pixel in a fifth embodiment of the OLED display panel of the present invention.

Specifically, as shown in FIG. 8, in the fifth embodiment of the present invention, the flat layer 3 and the pixel defining layer 5 simultaneously cover the transparent area 20 and the non-transparent area 30. The pixel defining layer 5 and the flat layer 3 that is in the transparent area 20 are formed by the transparent material, and the flat layer 3 in the non-transparent area 30 is formed by the black shielding material.

Figure 9:
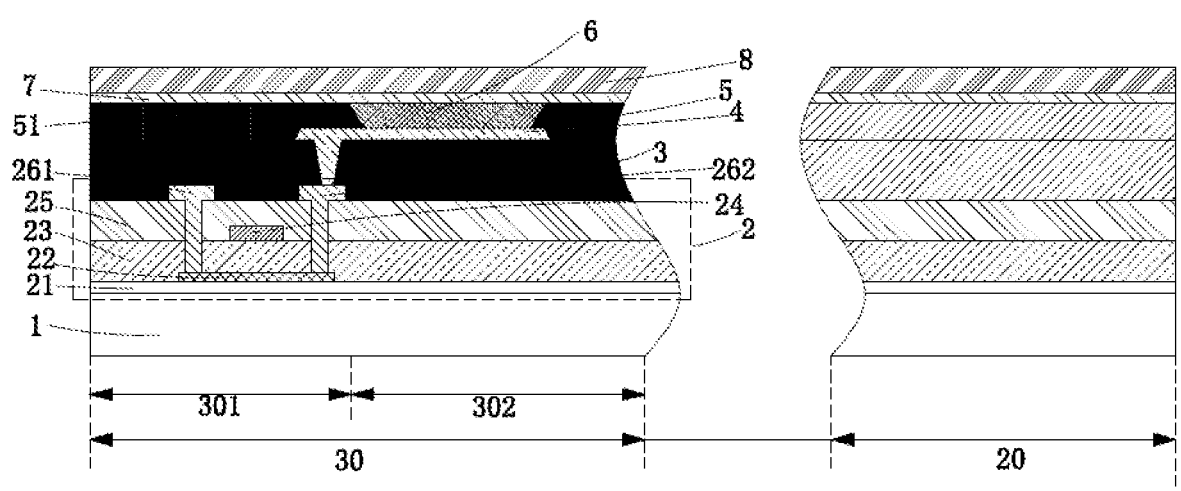
FIG. 9 is a structural view of a sub-pixel in a sixth embodiment of the OLED display panel of the present invention.

Specifically, as shown in FIG. 9, in the sixth embodiment of the present invention, the flat layer 3 and the pixel defining layer 5 simultaneously cover the transparent area 20 and the non-transparent area 30. The flat layer 3 that is in the transparent area 20 and the pixel defining layer 5 that is in the transparent area 20 are formed by the transparent material, and the pixel defining layer 5 that is in the non-transparent area 30 and the flat layer 3 that is in the sub-pixel 10 are formed by the black shielding material.

Figure 10:
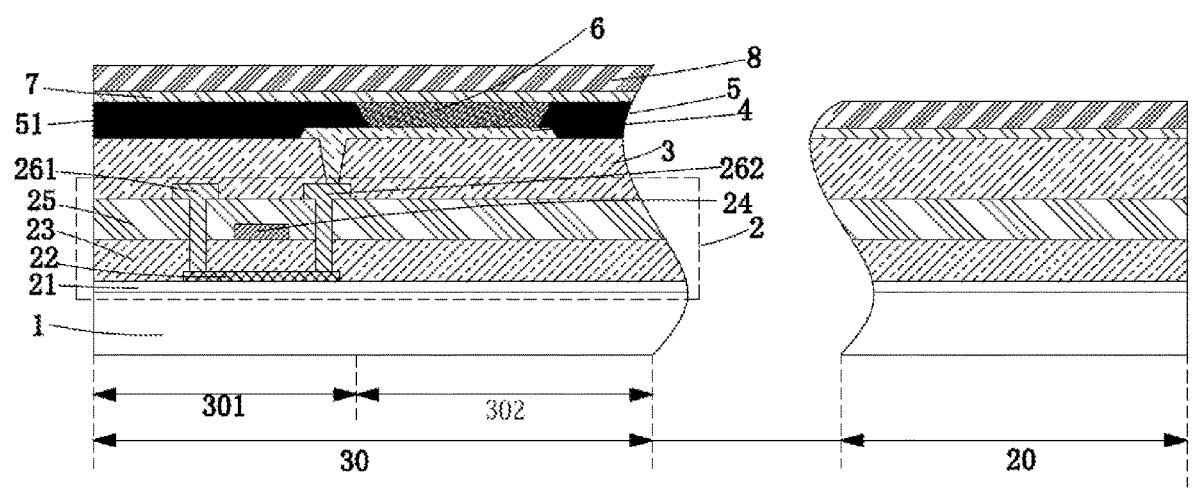
FIG. 10 is a structural view of a sub-pixel in a seventh embodiment of the OLED display panel of the present invention.

Specifically, as shown in FIG. 10, in the seventh embodiment of the present invention, the pixel defining layer 5 covers the non-transparent area 30, and the flat layer 3 covers the non-transparent area 30 and the transparent area 20 at the same time. The pixel defining layer 5 is formed by the black shielding material, and the flat layer 3 is formed by the transparent material.

Figure 11:
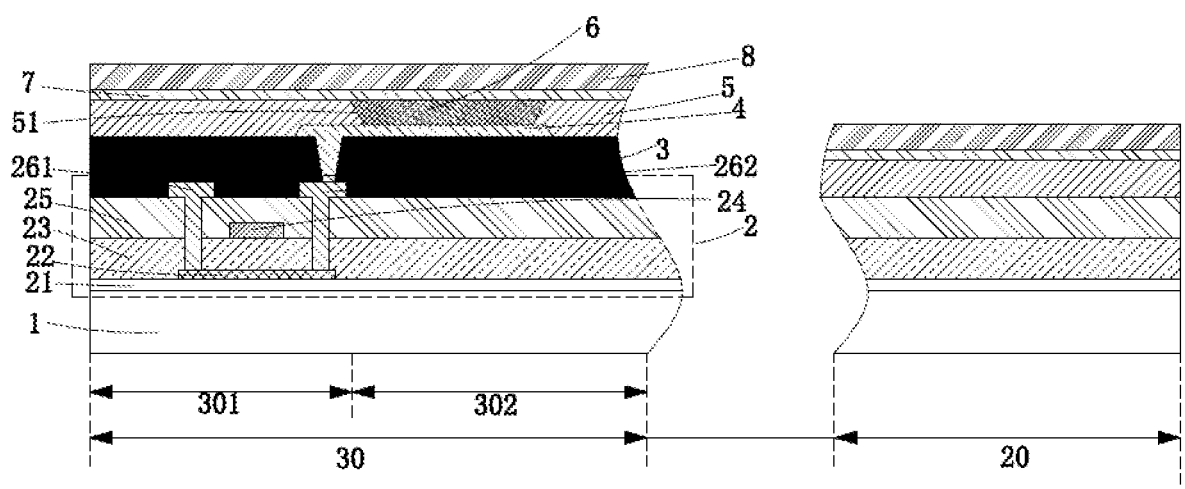
FIG. 11 is a structural view of a sub-pixel in an eighth embodiment of the OLED display panel of the present invention.

Specifically, as shown in FIG. 11, in the eighth embodiment of the present invention, the flat layer 3 covers the non-transparent area 30, and the pixel defining layer 5 covers the non-transparent area 30 and the transparent area 20 at the same time. The flat layer 3 is formed by the black shielding material, and the pixel defining layer 5 is formed by the transparent material.

Figure 12:
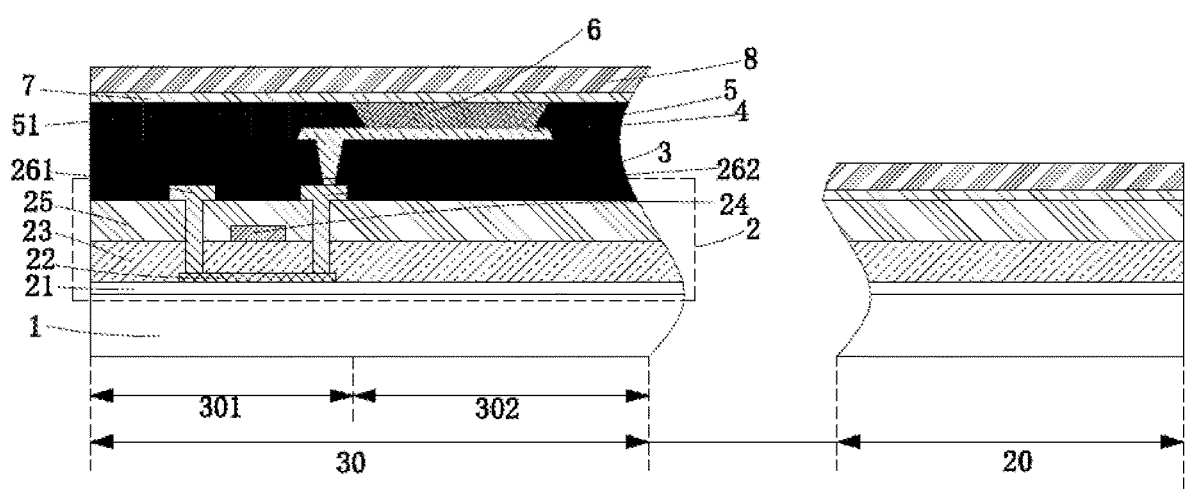
FIG. 12 is a structural view of a sub-pixel in a ninth embodiment of the OLED display panel of the present invention.

Specifically, as shown in FIG. 12, in the ninth embodiment of the present invention, both the flat layer 3 and the pixel defining layer 5 cover the non-transparent area 30, and the flat layer 3 and the pixel defining layer 5 are both formed by the black shielding material.

Thus, in the fourth to ninth embodiments of the present invention, the present invention is formed by providing at least one of the flat layer 3 and the pixel defining layer 5 in the non-transparent area 30 of the transparent OLED display panel with the black shielding material, thereby allowing at least one of the flat layer 3 and the pixel defining layer 5 to block/absorb ambient light, preventing ambient light from being transmitted into the TFT layer 2 through the flat layer 3 and the pixel defining layer 5, being reflected by the metal in the TFT layer 2 to In the user's eyes, the user's viewing is affected. At the same time, the flat layer 3 and the pixel defining layer 5 in the transparent area 30 are set to be transparent, or the flat layer 3 and the pixel defining layer 5 are not disposed, so that the transparent area 20 can be kept transparent, avoiding the flat layer 3 and the pixel defining layer 5 to affect the transparency of the transparent OLED display panel.

Preferably, the black shielding material is a black resin, and the transparent material is a transparent resin.

Further, when the flat layer 3 covers the transparent area 20 and the non-transparent area 30 at the same time, the flat layer 3 in the transparent area 20 is the transparent material, and the flat layer 3 in the non-transparent area 30 is the black shielding material. The flat layer 3 may be formed by the following steps: First, a black shielding flat layer 3 is formed in the non-transparent area 30 by a patterning process using the black shielding material, and then a transparent flat layer 3 is formed in the transparent area 20 by a coating or inkjet method, and maintaining the thickness of the flat layer 3 in the non-transparent area 30 and the transparent area 20 uniform or within a preset error range. Of course, the order of fabrication of the flat layer 3 in the non-transparent area 30 and the transparent area 20 may vary. It is also possible to form the flat layer 3 in the transparent area 20 by a patterning process, and then form the flat layer 3 in the non-transparent area 30 by coating or inkjet, etc., which does not affect the realization of the present invention.

Further, when the pixel defining layer 5 covers the transparent area 20 and the non-transparent area 30 at the same time, the pixel defining layer 5 in the transparent area 20 is the transparent material, and the pixel defining layer 5 in the non-transparent area 30 is the black shielding material. The pixel defining layer 5 may be formed by the following steps: First, a black shielding pixel defining layer 5 is formed in the non-transparent area 30 by a patterning process using the black shielding material, and then a transparent pixel defining layer 5 is formed in the transparent area 20 by a coating or inkjet method, and maintaining the thickness of the pixel defining layer 5 in the non-transparent area 30 and the transparent area 20 uniform or within a preset error range. Of course, the order of fabrication of the pixel defining layer 5 in the non-transparent area 30 and the transparent area 20 may vary. It is also possible to form the pixel defining layer 5 in the transparent area 20 by a patterning process, and then form the pixel defining layer 5 in the non-transparent area 30 by coating or inkjet, etc., which does not affect the realization of the present invention.

In summary, the present invention provides an OLED display panel. The display panel includes a plurality of sub-pixels arranged in an array. Each of the sub-pixels comprises a base substrate, a TFT layer disposed on the base substrate, a flat layer disposed on the TFT layer, a first electrode disposed on the flat layer, a pixel defining layer disposed on the first electrode and the flat layer, a light emitting layer disposed on the first electrode, a transparent second electrode disposed on the light emitting layer and the pixel defining layer, and an encapsulation layer disposed on the second electrode. A portion of at least one of the flat layer and the pixel defining layer is formed by the black shielding material. The OLED display panel can be prevented from reflecting ambient light without improving the light extraction efficiency, thereby improving the viewing experience of the OLED display panel by the arrangement of a portion of at least one of the flat layer and the pixel defining layer that is formed by the black shielding material.

In the above, various other changes and modifications can be made in accordance with the technical solutions and technical concept of the present invention, and all such changes and modifications are within the scope of the claims of the present invention.

What is claimed is:

1. An organic light emitting display (OLED) display panel, comprising a plurality of sub-pixels arranged in an array, wherein each of the sub-pixels comprises a base substrate, a thin-film transistor (TFT) layer disposed on the base substrate, a flat layer disposed on the TFT layer, a first electrode disposed on the flat layer, a pixel defining layer disposed on the first electrode and the flat layer, a light emitting layer disposed on the first electrode, a transparent second electrode disposed on the light emitting layer and the pixel defining layer, and an encapsulation layer disposed on the second electrode; and a portion of at least one of the flat layer and the pixel defining layer is formed by a black shielding material;

wherein each of the sub-pixels has a transparent area and a non-transparent area arranged in turn, and the first electrode and the light emitting layer are located in the non-transparent area;

wherein the flat layer is disposed above the non-transparent area, and the pixel defining layer is simultaneously disposed above the non-transparent area and the transparent area, the flat layer is formed by the black shielding material, and the pixel defining layer is formed by a transparent material.

2. The OLED display panel as claimed in claim 1, wherein one of the flat layer and the pixel defining layer is formed by the black shielding material, and the other layer of the flat layer and the pixel defining layer is formed by the transparent material.

3. The OLED display panel as claimed in claim 1, wherein both the flat layer and the pixel defining layer are formed by the black shielding material.

\* \* \* \* \*